United States Patent
Dioshongh et al.

(10) Patent No.: US 6,731,221 B1
(45) Date of Patent: May 4, 2004

(54) ELECTRICALLY MODIFIABLE PRODUCT LABELING

(75) Inventors: Terrance J. Dioshongh, Hillsboro, OR (US); Damion T. Searls, Portland, OR (US); Bin Lian, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/467,735

(22) Filed: Dec. 20, 1999

(51) Int. Cl.7 ................................................. G08B 7/00
(52) U.S. Cl. ................................ 340/691.6; 340/815.4; 29/739; 235/441; 235/454; 40/5; 345/27
(58) Field of Search ........................... 340/691.1, 691.6, 340/815.4, 815.83, 815.89; 345/35–40, 10, 27, 28, 25, 33; 235/462.01, 462.13, 441, 454; 40/299.01, 5; 29/739

(56) References Cited

U.S. PATENT DOCUMENTS

| | | | | |
|---|---|---|---|---|
| 3,835,424 A | * | 9/1974 | Marik | 334/87 |
| 5,276,435 A | * | 1/1994 | Rossides | 340/691.6 |
| 5,400,160 A | * | 3/1995 | Takahashi et al. | 349/60 |
| 5,412,312 A | * | 5/1995 | Crass et al. | 324/122 |
| 5,499,017 A | * | 3/1996 | Beigel | 340/572.1 |
| 5,539,976 A | * | 7/1996 | Miyauchi et al. | 29/740 |
| 5,644,102 A | * | 7/1997 | Rostoker | 174/52.1 |
| 5,686,759 A | * | 11/1997 | Hyde et al. | 257/730 |
| 5,751,257 A | * | 5/1998 | Sutherland | 345/1.2 |
| 5,838,286 A | * | 11/1998 | Pfeiffer et al. | 345/30 |
| 5,926,015 A | * | 7/1999 | Pharr | 324/114 |
| 5,936,819 A | * | 8/1999 | Masui | 361/103 |
| 5,953,047 A | * | 9/1999 | Nemirofsky | 725/23 |
| 5,984,190 A | * | 11/1999 | Nevill | 235/492 |
| 6,094,144 A | * | 7/2000 | Dishongh et al. | 340/653 |
| 6,118,419 A | * | 9/2000 | Smith et al. | 345/84 |
| 6,128,604 A | * | 10/2000 | Sakamaki et al. | 705/41 |
| 6,251,212 B1 | * | 6/2001 | Moh et al. | 156/308.2 |
| 6,297,789 B2 | * | 10/2001 | Gauthier et al. | 345/87 |
| 6,307,527 B1 | * | 10/2001 | Youngquist et al. | 345/39 |
| 6,448,889 B1 | * | 9/2002 | Hudson | 340/425.5 |

* cited by examiner

*Primary Examiner*—Benjamin C. Lee
(74) *Attorney, Agent, or Firm*—Blakely, Sokoloff, Taylor & Zafman LLP (57) ABSTRACT

An electrically modifiable label. In some embodiments, an electrically modifiable label may be applied to or form a part of products that have configurable or otherwise dynamic characteristics. That is, characteristics or desirability that vary over time or characteristics that may be selected or determined at or after advanced stages of manufacturing processes.

5 Claims, 7 Drawing Sheets

ELECTRICALLY MODIFIABLE PRODUCT LABELING

BACKGROUND

1. Field of the Invention

The present disclosure pertains to the field of product labeling. In particular, the present disclosure pertains to electronically modifiable product labeling that may, in some embodiments, be applied to or form a part of products that have configurable or otherwise dynamic characteristics. That is, characteristics or desirability that vary over time or characteristics that may be selected or determined at or after advanced stages of manufacturing processes.

2. Description of Related Art

The challenges that accompany marketing, labeling and positioning products abound. These challenges only increase where products have various different "flavors" which may be sold at different prices or under different marketing schemes. It may be disadvantageous to limit knowledge included in product labeling to information available at the time of initial manufacture.

For example, integrated circuits (ICs) are typically manufactured with numerous individual units (known as die) on a wafer. Testing the wafer prior to packaging each individual die is complicated by the small size of the features (e.g., contacts) on the integrated circuit die. Additionally, the package itself alters certain operating characteristics of the completed product. Therefore, some or even most of the testing of an IC is typically done after the integrated circuit has been packaged.

As a result, information about the IC is not determined until after reaching an advanced stage of manufacturing. Removing an IC from a manufacturing-type process to test the IC and then returning the IC to another manufacturing-type flow for labeling may be inefficient or inconvenient. Additionally, unlabelled products may be confused between testing and labeling. It would be preferable to complete manufacturing, including labeling, prior to the testing which finally determines the IC product characteristics. However, prior art labels or packaging are typically not easily and cleanly modifiable and/or are not sufficiently tamperproof to prevent fraudulent representation of the IC.

Providing adequate labeling that reflects information determined late in the manufacturing process or even after the manufacturing process is a common challenge across many different products and in many industries. Often, the use of static or pre-printed labels is delayed until the relevant characteristics of the product which are included on those labels are finally determined. As is true with ICs, this approach may be inefficient, susceptible to fraudulent alteration, and/or may not provide sufficient labeling flexibility for a wide variety of products.

SUMMARY

The present disclosure describes a product having a label portion that is electrically modifiable.

BRIEF DESCRIPTION OF THE FIGURES

The present invention is illustrated by way of example and not limitation in the figures of the accompanying drawings.

FIG. 1b illustrates details of one embodiment of an integrated circuit die 110 shown in FIG. 1a.

DETAILED DESCRIPTION

The following text describes electrically modifiable product labeling. In the following description, numerous specific details such as particular chemicals, compounds, products, patterns, label indicia, and the like are set forth in order to provide a more thorough understanding of the present invention. It will be appreciated, however, by one skilled in the art that the invention may be practiced without such specific details.

The described electrically modifiable product labeling may be advantageously utilized in many areas. Such product labeling is particularly advantageous where certain characteristics of the product are determined in advanced stages of manufacturing or after manufacturing is completed. Electrically modifiable labeling allows these late-determined characteristics to be reflected in the product labeling, which may be advantageous for inventory control, fraud reduction, and for assistance in analyzing customer returns or otherwise problematic parts.

Electrically modifiable labels may advantageously be applied to or form a part of semiconductors or other electronic components (e.g., to track features, frequencies, or the like). Electronically modifiable labels may also be used for perishables so that information relating to production date or other conditions that may affect the product's expected life span (e.g., storage temperatures, etc.). In general, electronically modifiable labels may advantageously be employed to track these or other inventory-related characteristics of many types of products or materials.

Figure 1A:
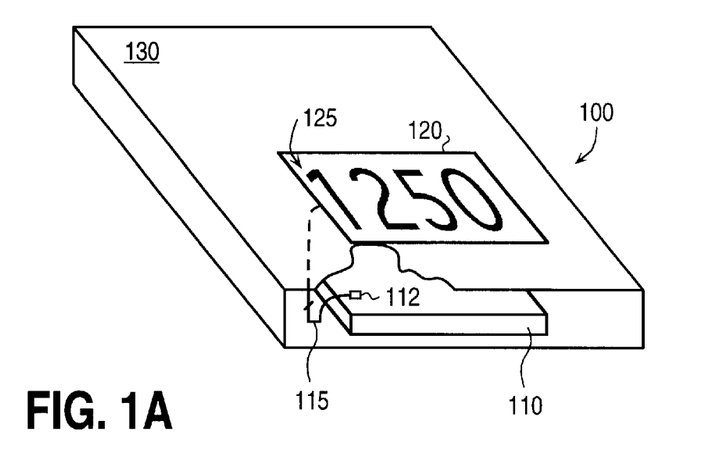
FIG. 1a illustrates one embodiment of a product having an electrically modifiable label.
Figure 1B:
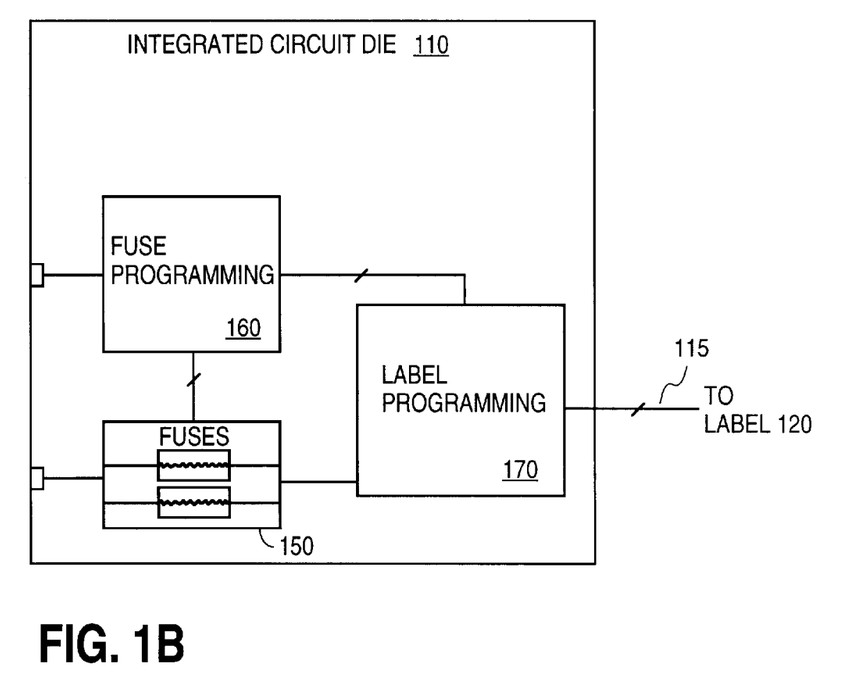

FIGS. 1a and 1b illustrate one example of an embodiment of a product having electrically modifiable labeling. As illustrated, an integrated circuit (IC) 100 has an electrically modifiable label portion 120. As referred to herein, the "label" or "label portion" may generally (except as otherwise specified) be integrally formed as a part of a product package or affixed or otherwise attached to a product package. In the illustrated embodiment, an IC package 130 may include the label portion 120 or have the label portion 120 attached thereto. The label portion 120 may be found on a circuit board substrate or other available packaging area of the IC 100. The exact packaging technology is not crucial, so any known or otherwise available packaging technique may be used.

The label portion 120 includes one or more product identifiers 125. The product identifiers 125 indicate, in either a human-readable or machine-detectable manner, one or more characteristics about the IC 100. The identifier(s) indicate the characteristics without requiring operation of the IC 100 itself at the time of observation. Characteristics of the underlying integrated circuit die 110, an identifier for in-demand product configuration, a combination of these two items, or other useful information may be specified.

As shown in FIG. 1*b*, the integrated circuit die 110 may include a set of fuses 150, a fuse programming circuit 160, and a label programming circuit 170, which may be coupled together as shown. The label programming circuit 170 is coupled to the label portion 120 by signal routing 115 that passes from a contact point 112 through the integrated circuit package. Any known or otherwise available packaging, routing, contact, and/or interconnect techniques may be used to connect operative circuits to the label portion 120.

In embodiments with fuse structures, the fuse programming circuit 160 and the label programming circuit 170 may operate in conjunction to blow a specified subset of the fuses 150 and to activate a corresponding subset of the product identifiers 125 to indicate selected product characteristics. Additionally, the opening of one or more of the fuses 150 may cause either or both of the fuse programming circuit 160 and the label programming circuit 170 to be thereafter disabled. The disabled circuit(s) may be at least partially electrically isolated by a blown fuse or may be logically programmed not to operate after a fuse has blown.

Figure 2A:
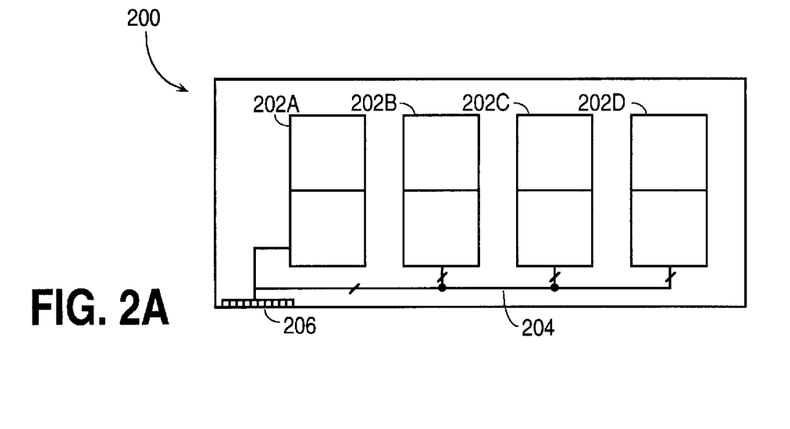
FIG. 2a illustrates one embodiment of an electrically modifiable label that utilizes an external programming circuit.
Figure 2B:
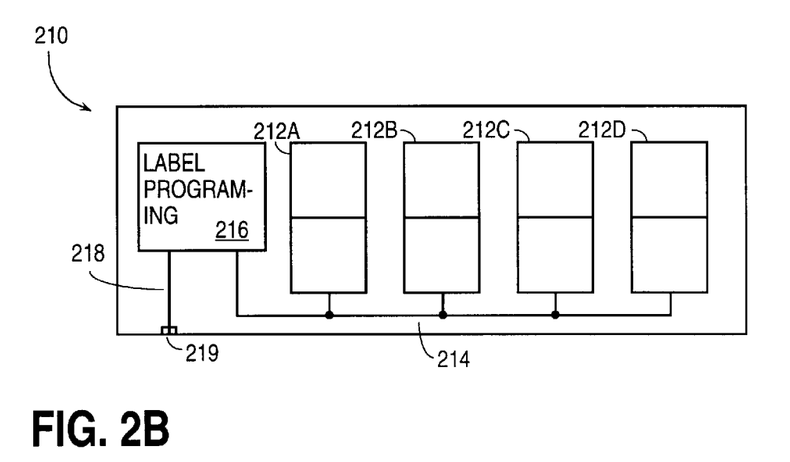
FIG. 2b illustrates one embodiment of an electrically modifiable label that includes a programming circuit.
Figure 2C:
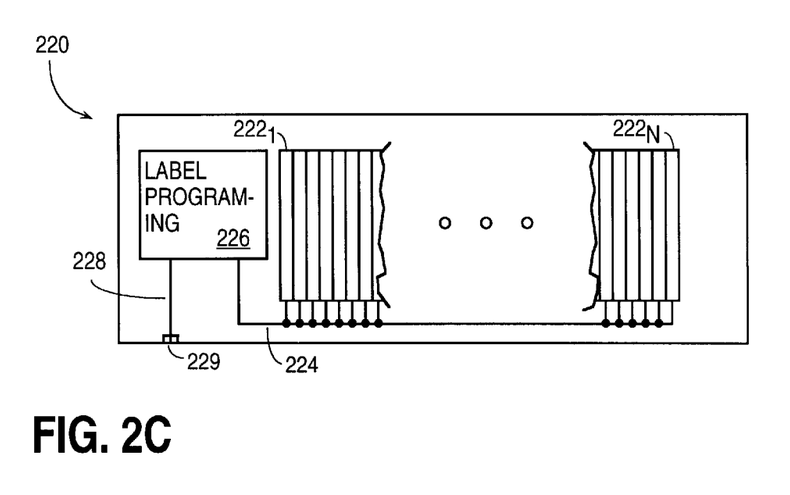
FIG. 2c illustrates one embodiment of an electrically modifiable label that is capable of being electrically modified to display a pattern such as a bar code.

FIGS. 2*a*–2*c* illustrate various embodiments of electrically modifiable or alterable labels. A label 200 in FIG. 2*a* includes four digits 200*a*–200*d* similar to traditional liquid crystal display (LCD) digits. Each digit includes a set of individual segments that can be electrically programmed to remain visible or at least detectable subsequent to removal of the programming voltage or current. Each of the digits is coupled by a bus 204 to a set of contacts 206. The programming voltage or current may be applied to the proper set of digit segments via the contacts 206 to provide the desired indication on the label.

Similarly, FIG. 2*b* illustrates a label 210 with digits 212*a*–212*d* coupled to a bus 214. Additionally, however, the label 210 of FIG. 2*b* includes a label programming circuit 216. The label programming circuit 216 is coupled to one or more contacts 219 via one or more signal lines 218. The label programming circuit 216 may function primarily as a de-multiplexer which serially receives signals indicative of the different segments of the label to be programmed. Alternatively, the label programming circuit 216 may include more elaborate logic that programs the label 210 in response to commands. Additionally, the voltage or current required to activate segments of the label 210 is typically generated separately from the label and any label programming circuit included in the label portion; however, voltage or current transformation circuitry may be provided as a part of the label portion if convenient or otherwise desirable.

FIG. 2*c* illustrates an embodiment of an electronically modifiable label 220 that differs from the embodiment of FIG. 2*b* primarily in the arrangement of the electrically alterable segments. In FIG. 2*c*, a plurality of segments 222(1)–**222(*n*) are arranged to allow formation of a particular pattern. In the illustrated embodiment, the segments are vertically oriented strips that are horizontally adjacent or proximate each other. Such an arrangement may be useful in forming an electrically modifiable bar code that may be easily detected or scanned by readily available bar code recognition equipment. Similarly to previous embodiments, the segments 222(1)–222(*n*) of the label 220 may be programmed using a bus 224 by a label programming circuit 226 responsive to external signals provided through contact(s) 229 and signal line(s) 228**. Alternatively, programming logic may be located separately from this label as well.

The various segments in the electrically modifiable label portions described herein may be formed in a variety of manners. The segments may be electrically altered by chemical, electrical, or thermal processes. Known or otherwise discovered and available compounds may be used to this end. In some embodiments, it may be desirable that the segments be modify-once segments that undergo irreversible chemical, electrical, or thermal changes. With modify-once segments, fraudulent alterations may be limited. Alternatively, electrical isolation or logical lock-out circuitry may be used to prevent modification subsequent to programming.

In some embodiments, a thermally activated polymer or ink may be combined with an electrical circuit. Thermochromatic substances are well known in the art (see, e.g., U.S. Pat. No. 5,591,255); however, various combinations thereof in a particular arrangement with or as a part of an electrical circuit are not. The electrical circuit may be deposited underneath the thermally activated polymer, or may be formed by electrically conductive particles either added to or forming the thermally activated substance. In either case, the circuit is sufficiently conductive to allow electrical heating. For example, a thermochromatic polymer may be impregnated with metallic or other conductive materials. The level of conductivity required may be determined on a case-by-case basis depending on the thermal characteristics of a selected polymer.

In one embodiment, a polymer that itself can undergo changes due to the application of an electrical current may be used. For example, the polymer polyaniline may be used (produced, for example, under the name ORMECON from the ORMECON subsidiary of Zipperling Kessler & Co. located at Ferdinand-Harten-Str. 7, D-22949 Ammersbek, Germany). In another embodiment, a thermochromatic and conductive lacquer mix is used. This mix may be a mix of a polymer such as polyaniline and a metallic or conductive material such as Minatec® (a colored to somewhat clear conductive plastic available from EM Industries of Hawthorne, N.Y.). Minatec® may be added in a particular concentration to appropriately vary conductivity. The various patterns desired may be silk screened or applied to printed circuit boards or other package materials by a photolithographic process.

It is not crucial that a polymer or any other particular material be used. In embodiments where thermally altered segments are used, any appropriate thermally alterable material or materials (that can change visual or other detectable properties) may be used. In embodiments where an electrochemical reaction occurs, any appropriate electrochemically alterable material or materials that change visual or other detectable properties may be used.

Figure 3:
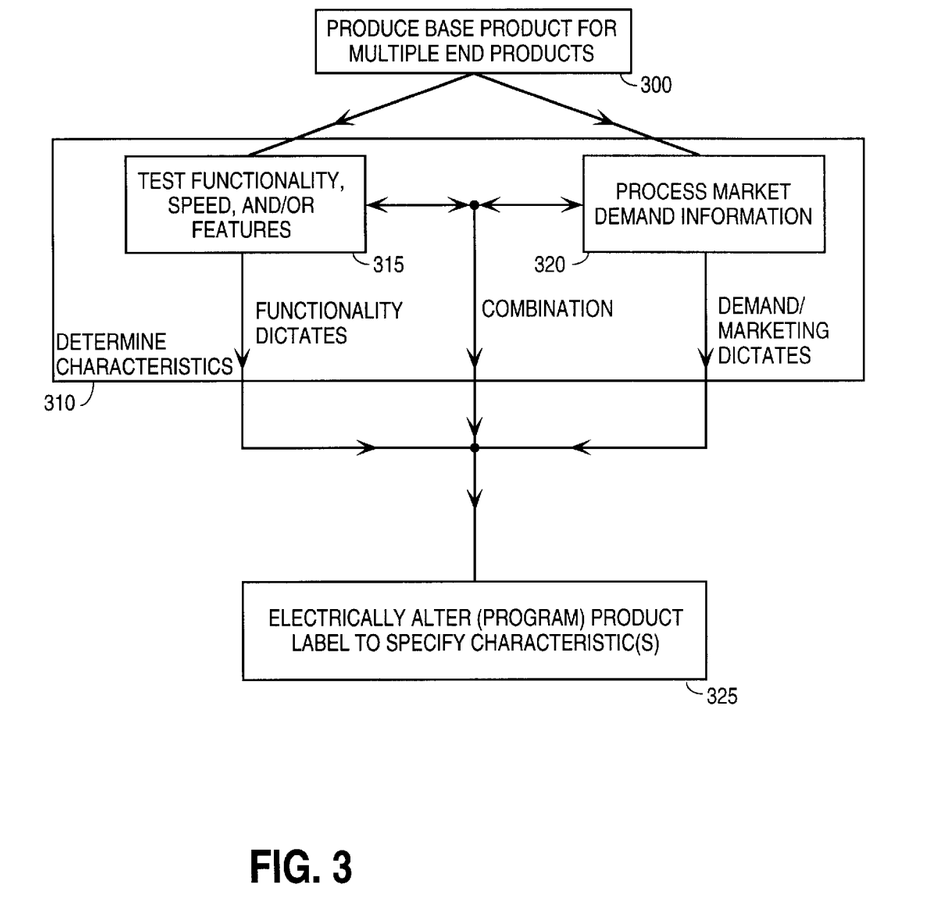
FIG. 3 illustrates one embodiment of a production process for a product having an electrically modifiable label.

FIG. 3 illustrates several embodiments of a process that may be utilized for a wide variety of products having electrically modifiable labels. In block 300, a base product that may ultimately evolve into one of several end products is produced. The base product may have a number of disable-able features (for marketing/demand or functionality reasons) or a variety of performance grades. Some products with electrically modifiable labels may have product characteristics ultimately determined through product testing, by demand or marketing analysis, or by a combination of the two.

Accordingly, block 310 indicates that several paths may be chosen to determine the product characteristics. In block 315, testing is performed. This testing may include testing the functionality of various portions, features, or subcomponents of the product. In some cases, the ultimate product configuration depends exclusively on the functionality analysis performed in block 315. In such cases, the functionality dictates the chosen characteristics, and the process continues to block 325.

In the other cases, a product may be fully functional and/or may not have disable-able subcomponents or separate performance grades. In such cases (and perhaps and others), marketing and/or consumer demand information may dictate characteristics chosen for the product. In this case, the process continues through block 320 and on to block 325.

Additionally, a hybrid approach may be used. In such cases the performance characteristics and/or functional characteristics are determined in block 315, and marketing and/or demand information is considered in block 320 (not necessarily in that order). Ultimately, a combination of this information can be used to best suit customer needs by selecting the appropriate and preferably most lucrative product characteristics based on consumer demand and the individual product functionality.

In block 325, the product label is altered to specify the characteristics chosen in block 310. Notably, significant time may have elapsed from the manufacture of the product to the ultimate labeling and shipment to a consumer. In such cases, the electrically modifiable label advantageously allows product mix at the time of shipment to accurately reflect demand at that time. In other cases, the label may be programmed shortly after packaging. In these cases, the label may reflect dynamic characteristics that vary in the interim due to either to the elapsed time or due to the packaging process itself. Thus, the electrically modifiable label allows late-determined characteristics to advantageously be reflected in product labeling.

Figure 4:
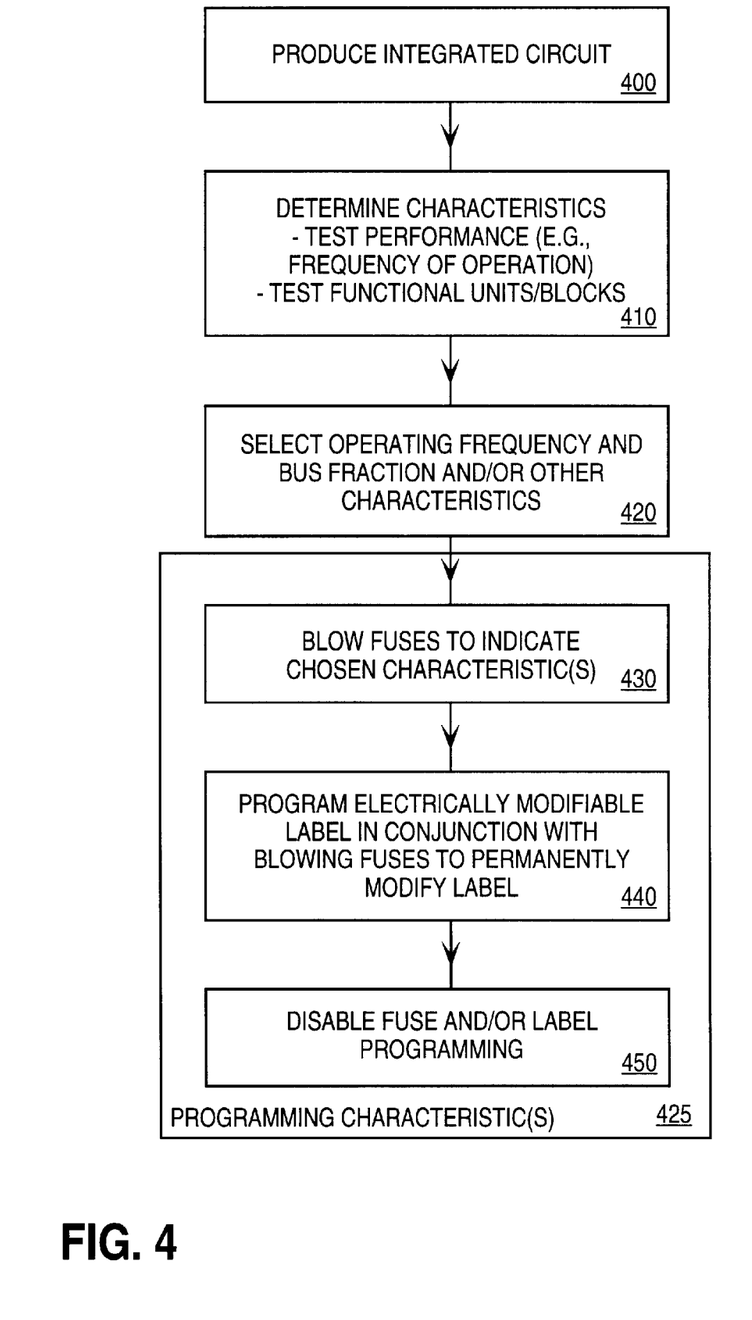
FIG. 4 illustrates one embodiment of a production process for an integrated circuit having both programmable fuses and an electrically modifiable label.

FIG. 4 illustrates one embodiment specific to the production of an integrated circuit or a module including one or more integrated circuits. In block 400, the integrated circuit is produced. As a part of this production, an electrically modifiable label is provided at some available point on the integrated circuit or its packaging. In block 410, tests are performed on the integrated circuit. For example, the integrated circuit may be tested by known or available techniques to determine a maximum frequency or frequencies at which it can safely and reliably operate. Additionally, or alternatively, various functional units or portions thereof may be tested. For example, a cache memory may be tested to determine whether all or part of the cache memory should be disabled. Similar testing may be performed on other functional units.

As shown in block 420, operating frequency and bus fraction (if applicable) as well as other tested characteristics are selected as a result of the testing. As indicated by block 425 these characteristics are next programmed. The programming may be performed as sequential operations or may be performed partially or wholly simultaneously as indicated by blocks 430, 440 and 450 being within block 425. If performed sequentially, these functions may be performed in an order other than that illustrated.

In block 430, fuses on the integrated circuit are blown to indicate the particular characteristics chosen. Such fuses as well as fuse-blowing techniques are known in the art (see, e.g., U.S. Pat. Nos. 5,734,274; 5,731,733; 5,789,970). As indicated in block 440, the electrically modifiable label is programmed in conjunction with blowing the fuses. In one embodiment, the label is permanently and irreversibly modified. As indicated in block 450, the fuse and/or label programming is disabled, thereby reducing the opportunity for fraudulently changing the label and reselling the product has a more expensive version.

Figure 5:
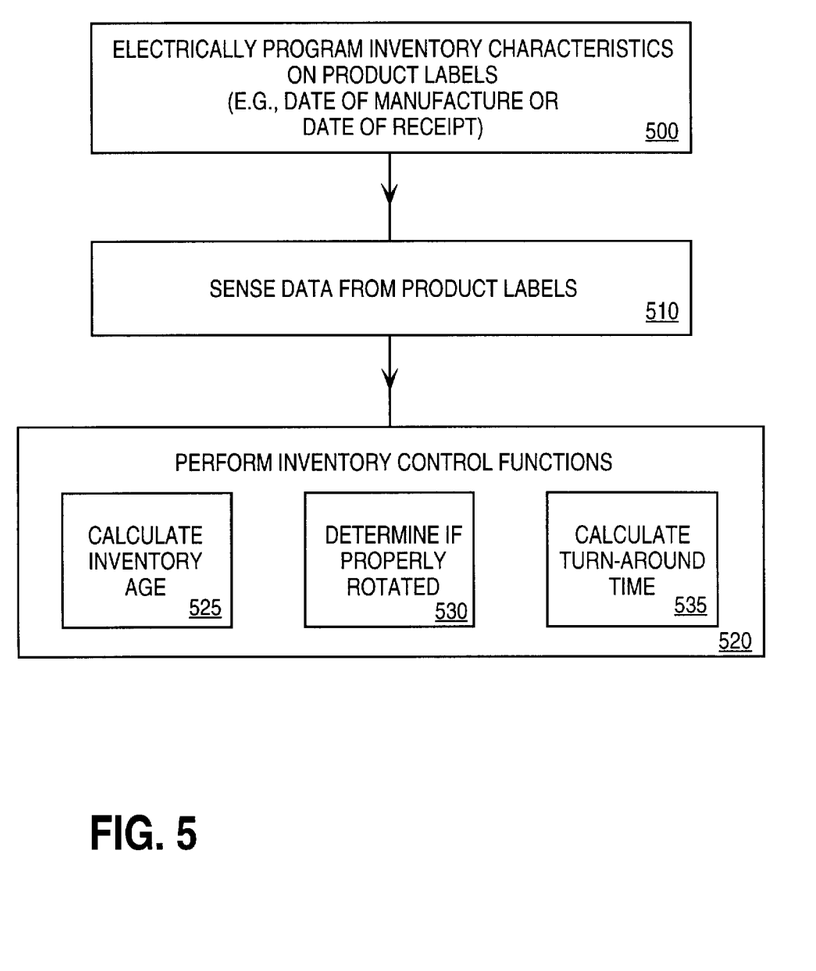
FIG. 5 illustrates one embodiment of a method of using products with electrically modifiable packages or labels for inventory control.

FIG. 5 illustrates one embodiment of another process in which electrically modifiable labels may be used. In block 500, an electrically modifiable label on each product is programmed with particular inventory characteristics. These characteristics include, but are not limited to, date of manufacture, date of receipt, expected shelf life, and the like. It may also be useful to assign a unique or a relatively unique number to inventory items in general or to inventory items of a particular type received on a particular day or within another particular time frame. Inventory control may be performed as a part of an independent inventory assessment, or as a part of receipt or dispatch of particular inventory items. In any case, at the chosen time, data is sensed from the product labels as indicated in block 510.

Thereafter, the sensed data (once loaded into a computer are other processing apparatus that processes such data) can be used to assess various aspects of the inventory as indicated in block 520. For example, as indicated in block 525, the inventory age may be calculated if a date received is provided on the electrically modifiable label. As indicated in block 530, it may be possible to determine if inventory is properly rotated. This may be accomplished by comparing the dates of receipt and dates of dispatch of particular inventory items. Additionally, as indicated in block 535, the turn-around time of the inventory may be calculated where the date of receipt is tracked in the date of dispatch is available.

Figure 6:
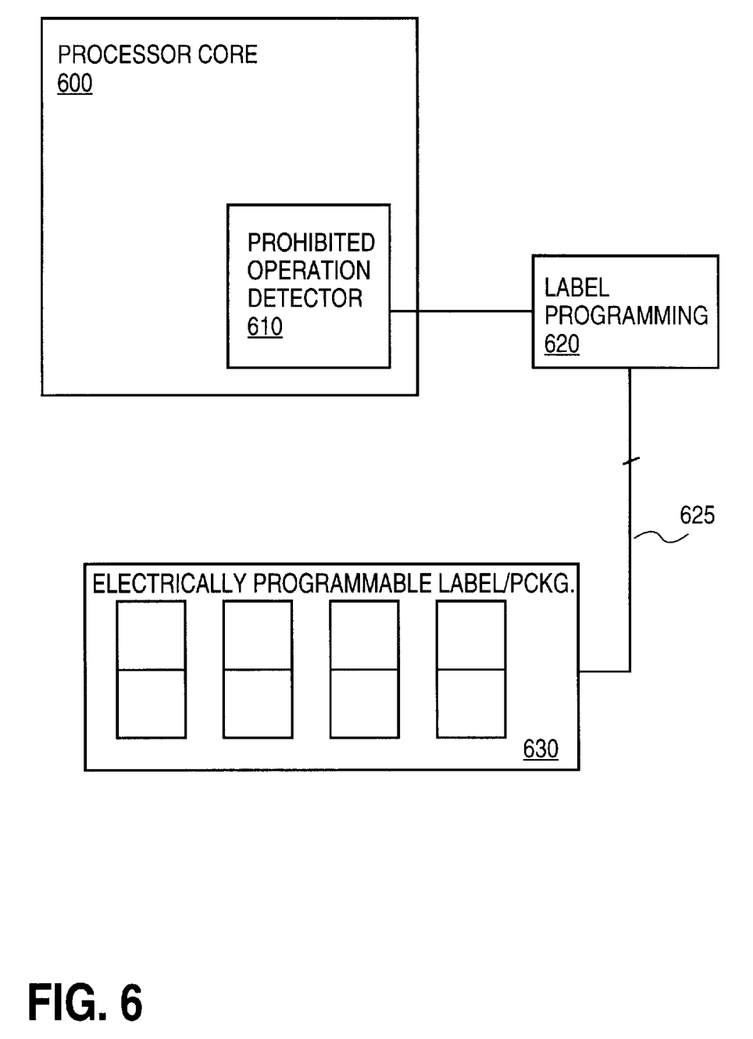
FIG. 6 illustrates one embodiment of a product that uses an electrically modifiable label or package to indicate operation under prohibited conditions.

FIG. 6 illustrates one embodiment of another application of electrically modifiable labels. FIG. 6 illustrates a processor core 600 that includes a prohibited operation detector 610. This prohibited operation detector 610 detects when the processor core 600 operates in a manner inconsistent with operating specification(s) or agreed to terms. When the prohibited operation detector detects prohibited operation, it signals a label programming circuit 620. The label programming circuit 620 may be included as a part of the same integrated circuit die, as a separate circuit in the integrated circuit package, as a part of the label, or located elsewhere within the overall system that includes the processor core 600. An electrically programmable label or package 630 is coupled by signal line(s) 625 to the label programming circuit 620 and appropriately indicates one or more prohibited operating conditions if they occur. Again, it may be advantageous to utilize an irreversible process so that the prohibited operation can not be easily masked.

Figure 7:
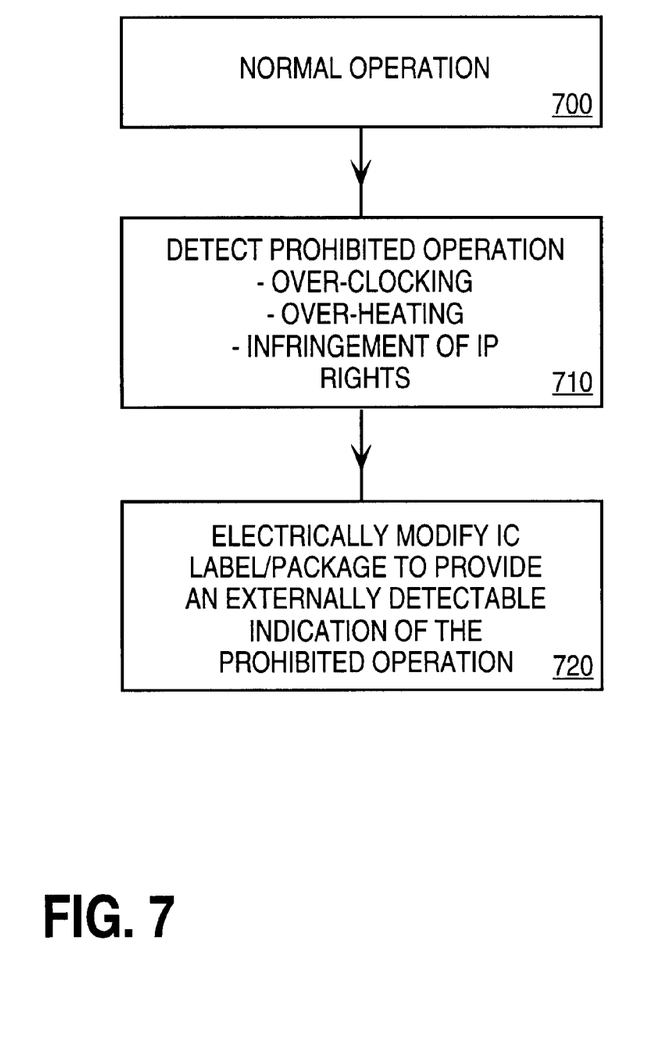
FIG. 7 illustrates one embodiment of a method of operating a product that is capable of detecting prohibited operating conditions.

The flowchart in FIG. 7 illustrates one embodiment of a method of operating a product, such as the one shown in FIG. 6, that is capable of detecting prohibited operating conditions. In block 700, the product operates under normal operating conditions. In block 710, however, a prohibited operating condition is detected. Examples of prohibited operating conditions for an integrated circuit may include over-clocking of the integrated circuit, over-heating of the integrated circuit, and the infringement of an intellectual property right by operation of the integrated circuit. Examples of infringement of an intellectual property right include the unauthorized execution of a software routine, unauthorized display of images or video, or unauthorized playback of audio. Such unauthorized use may be detected if data or instructions are tagged and no appropriate authorization is provided.

Finally, the integrated circuit label or package is modified to produce an externally detectable indication of the prohibited operation as indicated in block 720. In the cases of over-clocking and over-heating, this indication may be quite useful in processing customer returns or otherwise failed parts. In the case of infringement of intellectual property rights, the indicator may be useful in policing unauthorized uses of digital content or programs.

Thus, electrically modifiable product labeling that may be used in a wide variety of situations is disclosed. While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art upon studying this disclosure.

What is claimed is:

1. A label incorporated on an IC package, comprising:

An indicator which changes a visually detectable characteristic of said IC package upon application of an electrical current from said IC package, wherein the detectable characteristic is one or more characteristics chosen from a set consisting of:
   a frequency ratio indicating a ratio of operating frequencies of different portions of said IC package;
   an operating frequency of at least a portion of the IC package;
   a cache size of the IC package;
   an operating potential of the IC package; and
   a particular IC package feature which is either enabled or disabled as is indicated by the indicator.

2. The label of claim 1 wherein application of the electrical current permanently changes the detectable characteristic.

3. The label of claim 1 wherein said indicator is human readable.

4. The label of claim 1 wherein said indicator is detectable by electronic equipment.

5. The label of claim 1 wherein said indicator comprises a plurality of adjacent programmable segments capable of being enabled or disabled to form a bar code pattern.

* * * * *

UNITED STATES PATENT AND TRADEMARK OFFICE
CERTIFICATE OF CORRECTION

PATENT NO. : 6,731,221 B1  Page 1 of 1
DATED : May 4, 2004
INVENTOR(S) : Dioshongh et al.

It is certified that error appears in the above-identified patent and that said Letters Patent is hereby corrected as shown below:

<u>Title page,</u>
Item [12], delete "Dioshongh et al." and insert -- Dishongh et al. --.
Item [75], Inventors, delete "Terrance J. Dioshongh," and insert -- Terrance J. Dishongh, --.

Signed and Sealed this

Thirteenth Day of July, 2004

JON W. DUDAS
*Acting Director of the United States Patent and Trademark Office*